United States Patent
Park

(10) Patent No.: US 7,940,116 B2
(45) Date of Patent: May 10, 2011

(54) FUSE CIRCUIT AND SEMICONDUCTOR DEVICE INCLUDING THE SAME

(75) Inventor: Sang-Kyun Park, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/591,720

(22) Filed: Nov. 30, 2009

(65) Prior Publication Data

US 2010/0308896 A1    Dec. 9, 2010

(30) Foreign Application Priority Data

Jun. 3, 2009    (KR) .................. 10-2009-0049070

(51) Int. Cl.
*H01H 37/76*    (2006.01)
*H01H 85/00*    (2006.01)
(52) U.S. Cl. ........................................... 327/525
(58) Field of Classification Search .......... 327/525–526; 365/225.7
See application file for complete search history.

(56) References Cited

U.S. PATENT DOCUMENTS 6,667,916 B2 *  12/2003  Kyung ................... 365/201
2008/0054988 A1 *  3/2008  Shih ...................... 327/525

FOREIGN PATENT DOCUMENTS

| JP | 2000-089836 | 3/2000 |
| KR | 10-2007-0030627 | 3/2007 |
| KR | 10-2007-0076081 | 7/2007 |

\* cited by examiner

*Primary Examiner* — Quan Tra
(74) *Attorney, Agent, or Firm* — Harness, Dickey & Pierce, P.L.C.

(57) ABSTRACT

A fuse circuit may include a fuse section which generates a fuse control signal at an output terminal of the fuse circuit in response to a power-up signal according to a status of a fuse in the fuse section; and a current path break section which detects the status of the fuse in the fuse section prior to a trip period of the power-up signal and breaks an inrush current path created in the fuse section during the trip period based on the detected status.

11 Claims, 8 Drawing Sheets

FUSE CIRCUIT AND SEMICONDUCTOR DEVICE INCLUDING THE SAME

CROSS REFERENCE TO RELATED APPLICATIONS

This application claims priority under 35 U.S.C. §119 from Korean Patent Application 10-2009-0049070, filed in the Korean Intellectual Property Office on Jun. 3, 2009, the entire contents of which are incorporated herein by reference.

BACKGROUND

1. Field

Example embodiments relate to a semiconductor device, particularly, to a fuse circuit for a semiconductor device capable of reducing an inrush current produced during a power-up period.

2. Description of the Related Art

Semiconductor devices, such as a dynamic random access memory (DRAM) and the like, which are used as memory elements in an electronic system have a high integration density and operate at high speeds.

In high-performance DRAMs, such as SDRAM (Synchronous DRAM), DDR SDRAM (Double Data Rate SDRAM), FCRAM (Fast Cycle RAM), and the like, as well as the typical DRAM, a fuse circuit may be used. A fuse circuit which may include a laser or current-cuttable fuse and a MOS transistor is widely used in a redundancy circuit for replacing defective memory cells.

An inrush current may be generated by the fuse circuit during power-up of the semiconductor device. The term "power-up period" used herein means a period until the level of a power supply voltage applied to the semiconductor device reaches a set voltage level. The inrush current is generated when the fuse in the fuse circuit is uncut, and as the number of fuse circuits increases, the amount of current increases. In a period before power supply reaches a set level, that is, during the power-up period, the inrush current may be generated when a P-type MOS transistor and an N-type MOS transistor constituting the fuse circuit are on at the same time.

Accordingly, when a large amount of current is generated due to the inrush current during the power-up period, a heavier load may be imposed on initial driving of the internal power voltage generator in the semiconductor device. Accordingly, the operation stability of the internal power voltage generator may deteriorate, causing deterioration in the reliability of operation of the semiconductor device or electronic system. In particular, in the case of a mobile DRAM which is provided in a portable electronic system, for example, the amount of power to be supplied is relatively small, so if the inrush current is generated in the power-up period, the power setting operation may not be normally performed.

SUMMARY

Example embodiments are directed to a fuse circuit including a fuse section and a current path break section. The fuse section may generate a fuse control signal at an output terminal of the fuse circuit in response to a power-up signal according to a status of a fuse in the fuse section. A current path break section may detect the status of the fuse in the fuse section prior to a trip period of the power-up signal and may breaks an inrush current path created in the fuse section during the trip period based on the detected status.

According to an example embodiment, the fuse section may include a cuttable fuse a first P-type MOS transistor which has a gate to which the power-up signal is applied, a source to which a power supply voltage is applied, and a drain connected to one end of the fuse; a first N-type MOS transistor which has a drain connected to another end of the fuse, a gate to which the power-up signal is applied, and a source to which a ground voltage is applied; and a latch which is connected between the another end of the fuse and the output terminal so as to latch a voltage level on the drain of the first N-type MOS transistor.

According to an example embodiment, the current path break section may include a second N-type MOS transistor which has a gate to which the power-up signal is applied, a drain to which the power supply voltage is applied, and a source connected to the one end of the fuse; and a third N-type MOS transistor which has a gate connected to the source of the second N-type MOS transistor, and a drain-source channel connected between the latch and the ground voltage.

According to an example embodiment, the first N-type MOS transistor may be larger in size than the second N-type MOS transistor.

According to an example embodiment, the second N-type MOS transistor may detect the status of the fuse as a low level signal prior to the trip period of the power-up signal when the fuse is uncut, and may detect the status of the fuse as a high level signal prior to and after the trip period of the power-up signal when the fuse is cut.

According to another example embodiment, a semiconductor device may include a fuse circuit as described above, an internal power voltage generator which generates an internal power supply voltage and a power-up signal generator which generates the power-up signal in response to the internal power supply voltage in a power-up period.

According to an example embodiment, the fuse section of the semiconductor device may include a cuttable fuse; a first P-type MOS transistor which has a gate to which the power-up signal is applied, a source to which a power supply voltage is applied, and a drain connected to one end of the fuse; a first N-type MOS transistor which has a drain connected to another end of the fuse, a gate to which the power-up signal is applied, and a source to which a ground voltage is applied; and a latch which is connected to the another end of the fuse and the output terminal so as to latch a voltage level on the drain of the first N-type MOS transistor.

According to an example embodiment, the current path break section of the semiconductor device a second N-type MOS transistor which has a gate to which the power-up signal is applied, a drain to which the power supply voltage is applied, and a source connected to the one end of the fuse; and a third N-type MOS transistor which has a gate connected to the source of the second N-type MOS transistor, and a drain-source channel connected between the latch and the ground voltage.

According to another example embodiment, wherein the second N-type MOS transistor included in the semiconductor device may detect the status of the fuse as a low level signal prior to the trip period of the power-up signal when the fuse is uncut and may detect the status of the fuse as a high level signal prior to and after the trip period of the power-up signal when the fuse is cut.

According to an example embodiment, a method of reducing an inrush current in a fuse circuit may include detecting the status of the fuse prior to a trip period of the power-up signal; and breaking an inrush current path created in the fuse section during the trip period of the power-up signal based on the detected status of the fuse.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DESCRIPTION OF EXAMPLE EMBODIMENTS

Figure 1:
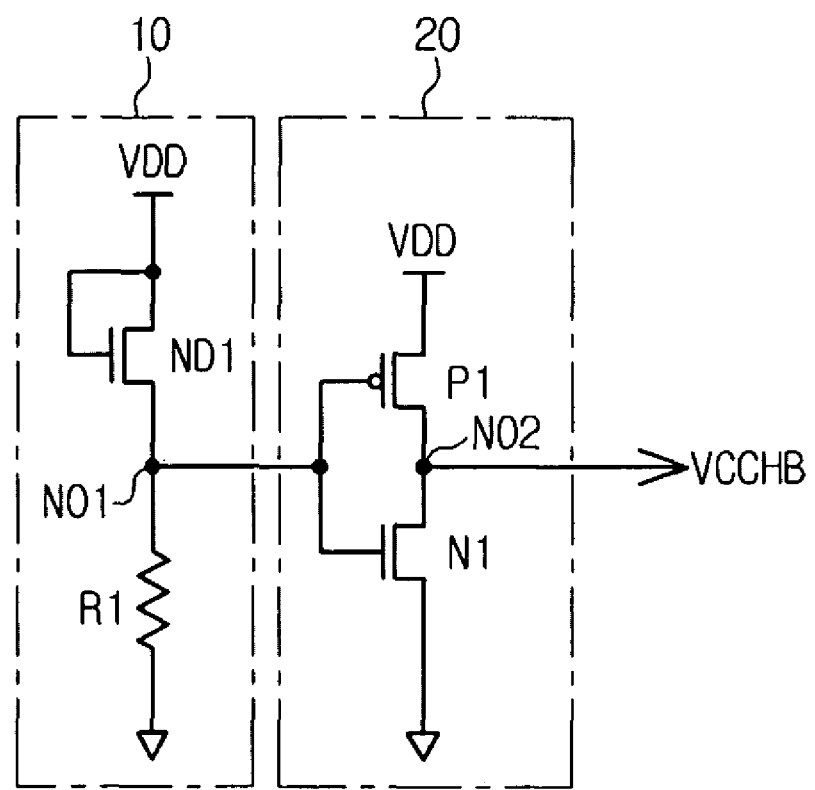
FIG. 1 is a circuit diagram of a conventional power-up signal generator.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Referring to FIG. 1, a power-up signal generator includes a level detection section 10 which detects a level of an applied power supply voltage VDD, and a buffer section 20 which buffers a level detection signal output from the level detection section 10 and generates a power-up signal VCCHB.

The level detection section 10 may include an N-type MOS transistor ND1 having a diode coupling structure between a power supply voltage (VDD) terminal and an output node NO1, and a resistor R1 connected between the source of the N-type MOS transistor ND1 and a ground terminal. The buffer section 20 may include an inverter formed of a P-type MOS transistor P1 and an N-type MOS transistor N1 connected between the power supply voltage (VDD) terminal and the ground terminal. The output node NO1 is connected to the common gate of the P-type MOS transistor P1 and the N-type MOS transistor N1. The power supply voltage VDD is applied to the source of the P-type MOS transistor P1, and the source of the N-type MOS transistor N1 is connected to the ground. The power-up signal VCCHB is output from the output node of the buffer section 20, for example, the common drain of the P-type MOS transistor P1 and the N-type MOS transistor N1. An additional buffer section (not shown) may be provided preceding the buffer section 20 to generate a power-up signal VCCH having a phase opposite to the power-up signal VCCHB. As such, the power-up signal VCCHB may be an inverted version of the power-up signal VCCH.

Figure 2:
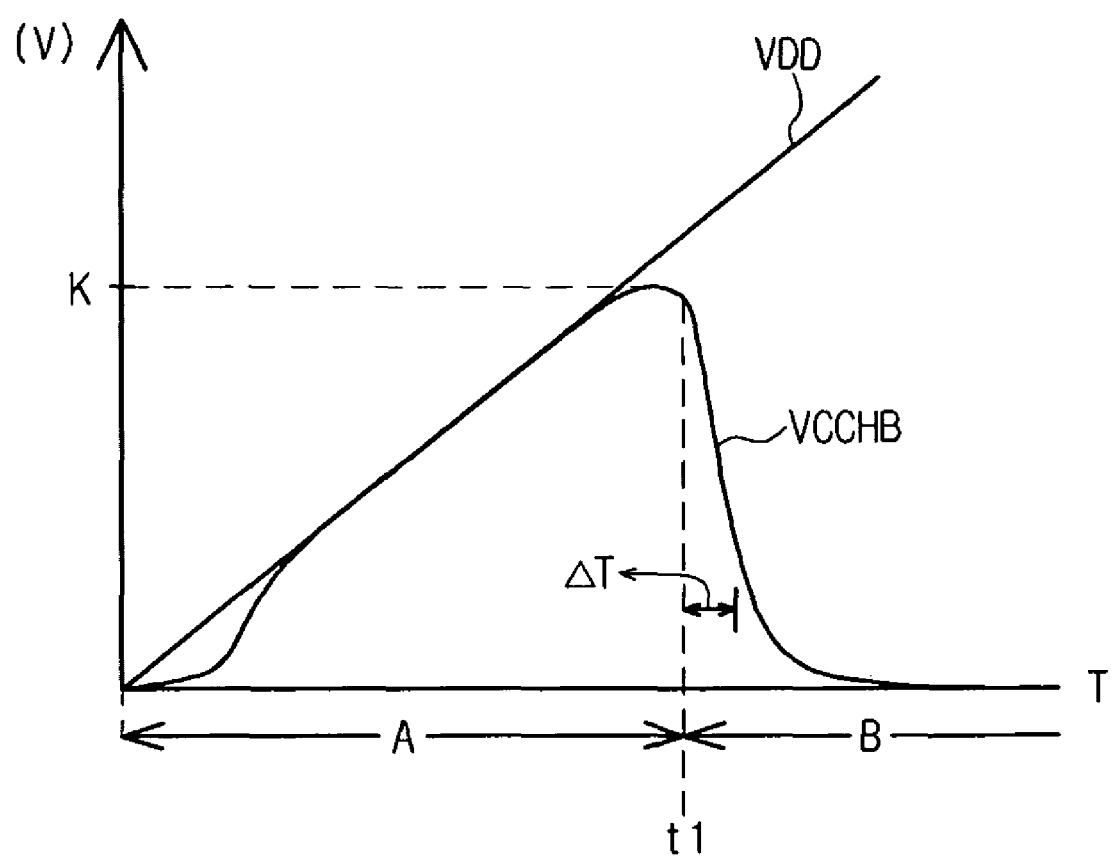
FIG. 2 is a waveform of a power-up signal output from the circuit of FIG. 1 during a power-up operation.

The power-up signal VCCHB is generated as shown in FIG. 2. In FIG. 2, the horizontal axis represents time, and the vertical axis represents a voltage (V).

The power supply voltage VDD, increasing from 0 V to a set level, is supplied to the circuit of FIG. 1. In a power-up period, during which the level of the power supply voltage VDD increases, the N-type MOS transistor ND1 in the level detection section 10 is off until the level of the power supply voltage VDD reaches a threshold voltage level. Thus, no voltage is applied to the output node NO1, and the output node NO1 may be considered to be at low level. A low level at output node NO1 causes the P-type MOS transistor P1 in the buffer section 20 to turn on, and the level of the power-up signal VCCHB increases in the direction of the trip point t1 along with the power supply voltage VDD, as shown in the period A of the waveform VCCHB of FIG. 2.

When the level of the power supply voltage VDD increases to a level K V (for example, about 0.5 V to 0.7 V), higher than the threshold voltage of the N-type MOS transistor ND1, the N-type MOS transistor ND1 is turned on. When this happens, the voltage level of the output node NO1 is increased to high level, causing the P-type MOS transistor P1 to turn off and the N-type MOS transistor N1 to turn on. If the P-type MOS transistor P1 is completely turned off and the N-type MOS transistor N1 is completely turned on, the level of the power-up signal VCCHB falls to the ground voltage level after the trip point t1, as shown in the waveform VCCHB in the period B of FIG. 2. As is seen, the power-up signal VCCHB increases along with the power supply voltage VDD and is maintained at high level in the period A before the trip point t1, and the power-up signal VCCHB falls to the ground level after the trip point t1. However, the power supply voltage VDD continues to increase. The voltage required to turn on the N-type MOS transistor ND1 functioning as a diode is referred to as a trip voltage t1, and the period (ΔT of FIG. 2) during which the level of the power-up signal VCCHB falls down to the ground level after the trip point t1 is referred to as a trip period. Thus, the trip period is included in the power-up period.

The power-up signal generator of FIG. 1 is also called as an initialization signal generation circuit or a power-up reset circuit.

Figure 3:
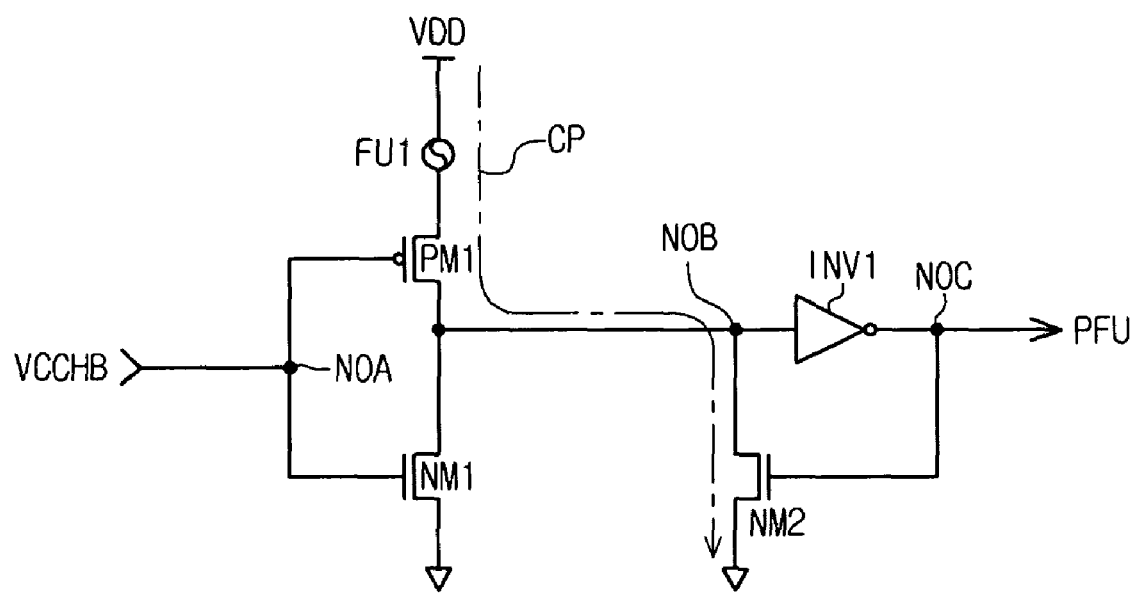
FIG. 3 is a circuit diagram of a conventional fuse circuit for a semiconductor device in which an inrush current path is formed.

When the power-up signal VCCHB, generated using the circuit of FIG. 1, is applied to a fuse circuit of FIG. 3, an inrush current path CP, as shown, may be generated.

The fuse circuit of FIG. 3 includes a fuse FU1, a P-type MOS transistor PM1, N-type MOS transistors NM1 and NM2, and an inverter INV1.

The fuse FU1 may be cut using a laser or current. The P-type MOS transistor PM1 has a gate to which the power-up signal VCCHB is applied, a source to which the power supply voltage VDD is applied through the fuse FU1, and a drain connected to a latch node NOB. The N-type MOS transistor NM1 has a drain connected to the latch node NOB, a gate to which the power-up signal VCCHB is applied, and a source to which the ground voltage is applied.

The inverter INV1 and the N-type MOS transistor NM2 are provided between the latch node NOB and an output node NOC to form an inverter latch, which inverts the input level of the latch node NOB and outputs a fuse control signal PFU at the output node NOC.

When the fuse FU1 is uncut, the level of the fuse control signal PFU is maintained at high level before the trip point t1 of the power-up signal VCCHB and the level of the fuse control signal PFU is changed to low level after the trip point t1. Specifically, if the power-up signal VCCHB is applied to an input node NOA of FIG. 3 before the trip point t1, the N-type MOS transistor NM1 is turned on, the latch node NOB is at low level, and the fuse control signal PFU on the output node NOC is at high level. At this time, the N-type MOS transistor NM2 is turned on due to the output node NOC at high level, and the latch node NOB is latched at low level. After the trip point t1, a low level of the power-up signal VCCHB is applied to the input node NOA of FIG. 3. Accordingly, the N-type MOS transistor NM1 is turned off, and the P-type MOS transistor PM1 is turned on. The latch node NOB is at high voltage level, and the fuse control signal PFU at the output node NOC is changed to low level. As a result, when the fuse is uncut, the fuse control signal PFU is maintained at low level after the power-up period.

In order to implement a redundancy scheme for substituting defective memory cells with redundancy memory cells, when the fuse FU1 is cut, the fuse control signal PFU is maintained at high level before and after the trip point t1 of the power-up signal VCCHB. Specifically, if the power-up signal VCCHB is applied to the input node NOA of FIG. 3 before the trip point t1, the N-type MOS transistor NM1 is turned on, the latch node NOB is at low level, and the fuse control signal PFU on the output node NOC is at high level. At this time, the N-type MOS transistor NM2, is turned on due to the output node NOC being at high level, and the latch node NOB is latched at low level. After the trip point t1, the power-up signal VCCHB is applied at low level to the input node NOA of FIG. 3. The N-type MOS transistor NM1 is turned off, and the P-type MOS transistor PM1 is also turned off since no power supply voltage VDD is applied through the fuse FU1. Thus, the latch node NOB is still maintained at low level, and the fuse control signal PFU on the output node NOC is maintained at high level. As a result, when the fuse is cut, the fuse control signal PFU is continuously maintained at high level after the power-up period.

In the circuit of FIG. 3, there is a period during which the P-type MOS transistor PM1 and the N-type MOS transistor NM2 may be turned on together when the fuse is uncut, generating an inrush current path CP. That is, as described with reference to FIG. 2, in the trip period (ΔT of FIG. 2), the power-up signal VCCHB falls down from K V to the ground level, so if the P-type MOS transistor PM1 is turned on when the N-type MOS transistor NM2 of the inverter latch is not completely turned off, the inrush current path CP may be generated. As a result, during the trip period, the P-type MOS transistor PM1 is turned on while the N-type MOS transistor NM2 is still on, the inrush current path CP, including the fuse FU1, the P-type MOS transistor PM1, the latch node NOB, and the N-type MOS transistor NM2, is generated. Such an inrush current may cause operational reliability and power supply stability issues.

Figure 4:
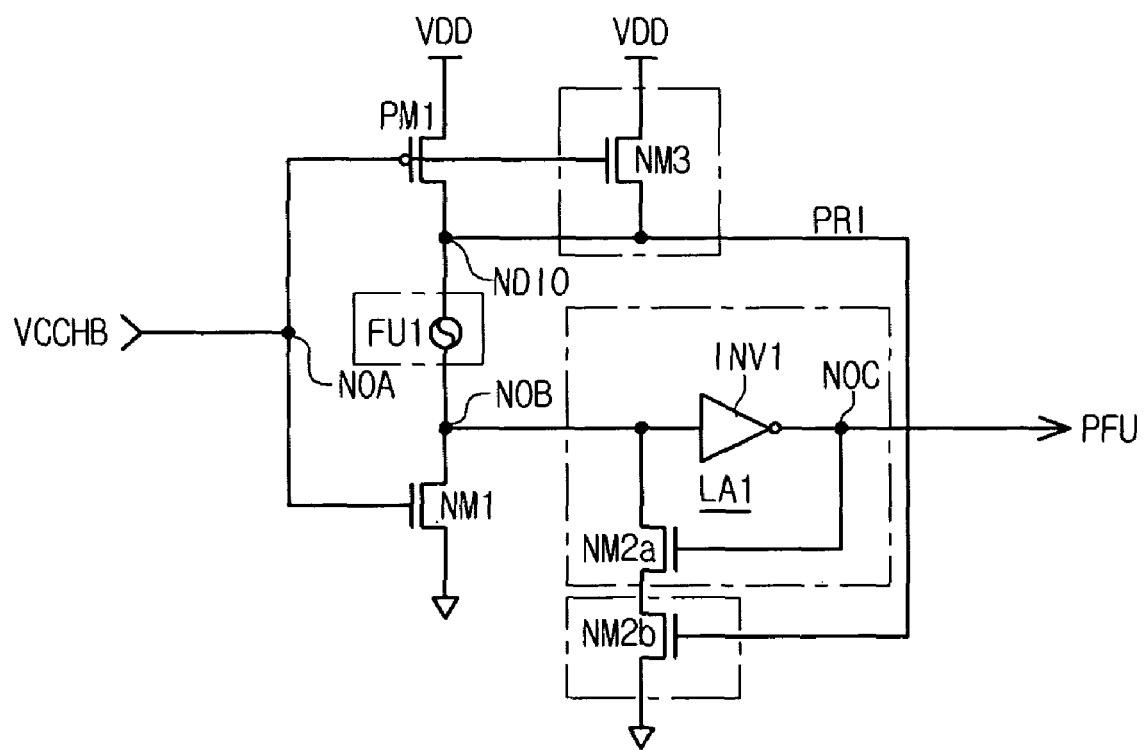
FIGS. 4 and 5 are circuit diagrams of a fuse circuit for a semiconductor device according to an example embodiment.
Figure 5:
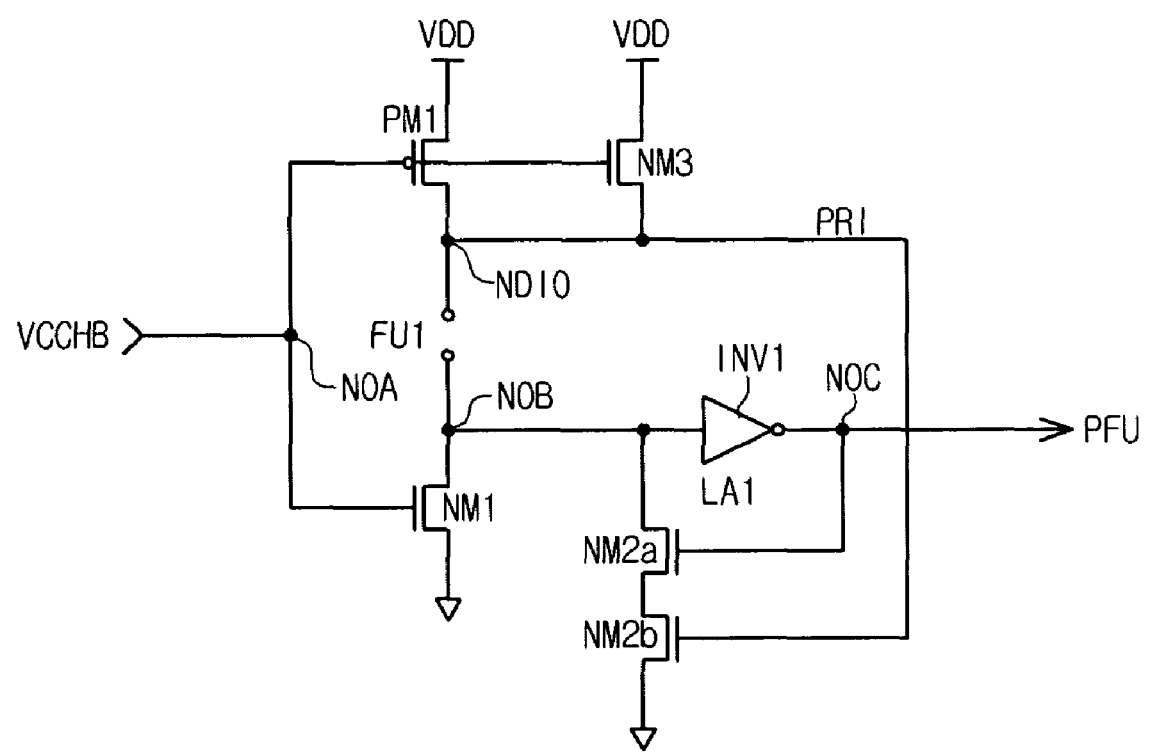

FIGS. 4 and 5 are circuit diagrams of a fuse circuit, for example a fuse circuit for a semiconductor device, according to an example embodiment. FIG. 4 shows a state wherein the fuse FU1 is uncut, and FIG. 5 shows a state wherein the fuse FU1 is cut. As is seen, the circuit structure of FIG. 5 may be obtained when the fuse FU1 of FIG. 4 is cut.

Figure 6:
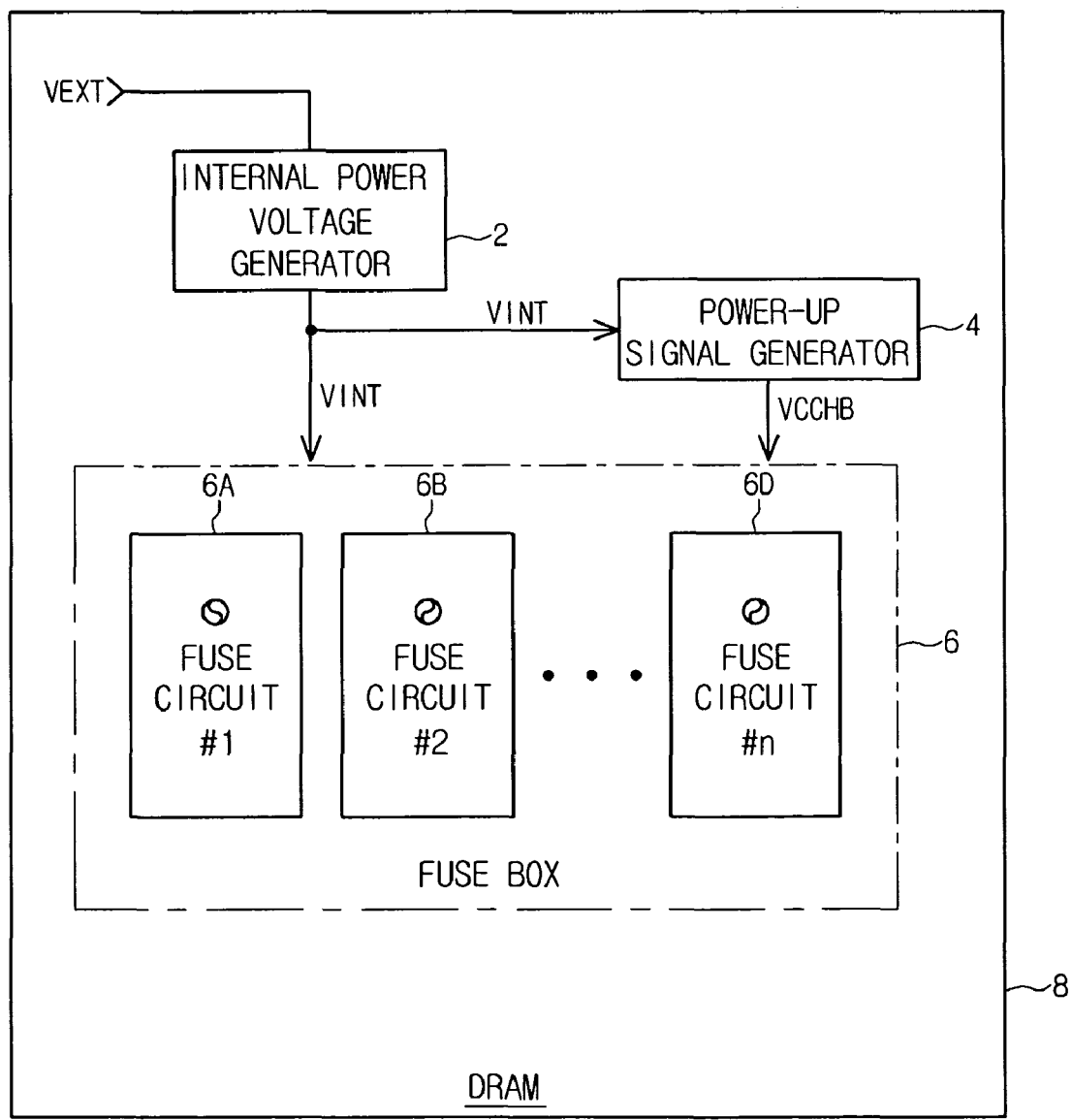
FIG. 6 is a block diagram of a semiconductor device including a fuse box having a plurality of the fuse circuits shown in FIG. 4.
Figure 7:
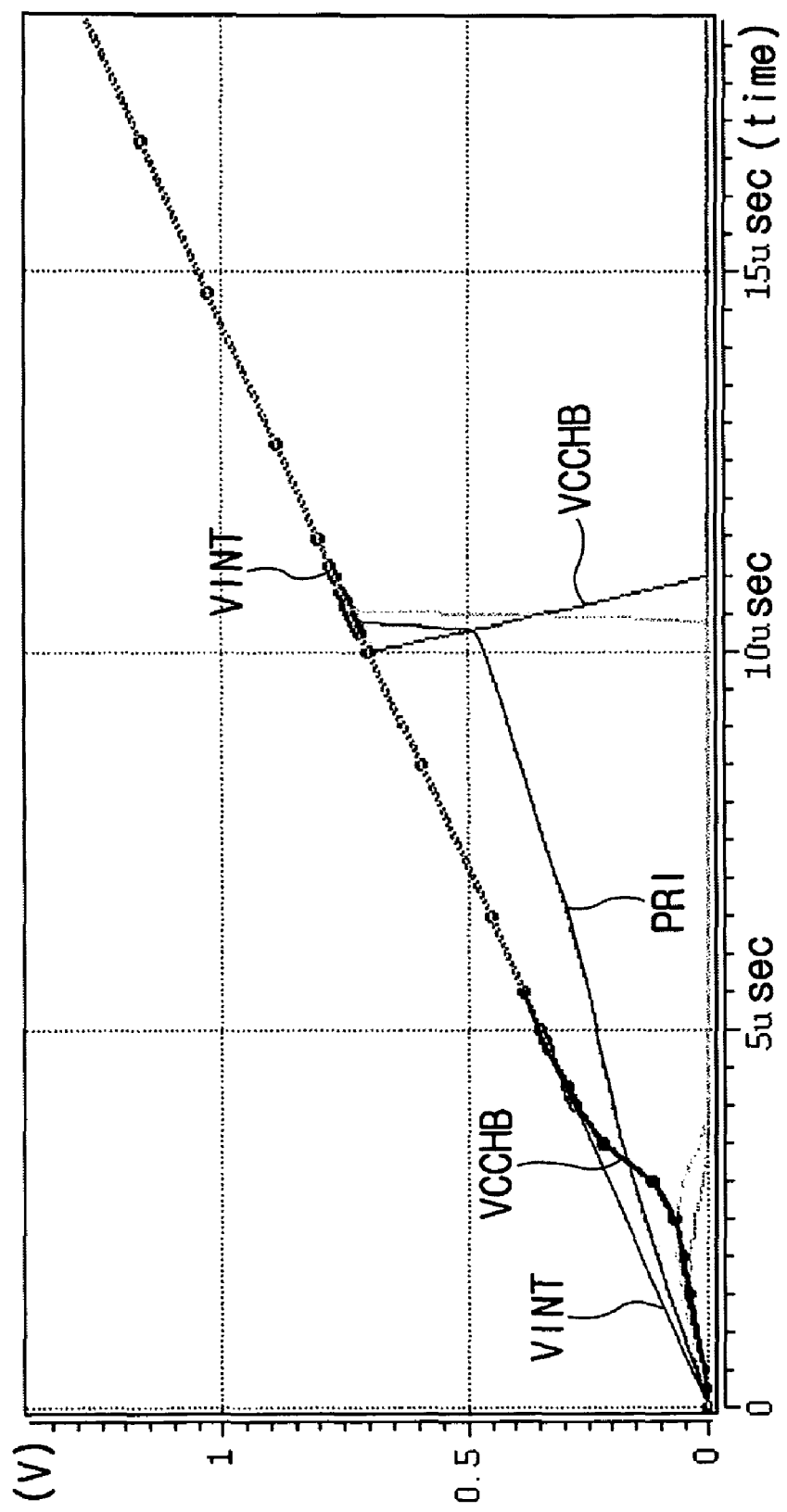
FIG. 7 is a waveform showing a power-up signal generated by the circuit of FIG. 4 in a power-up period and information regarding the status (cut or uncut) of a fuse.
Figure 8:
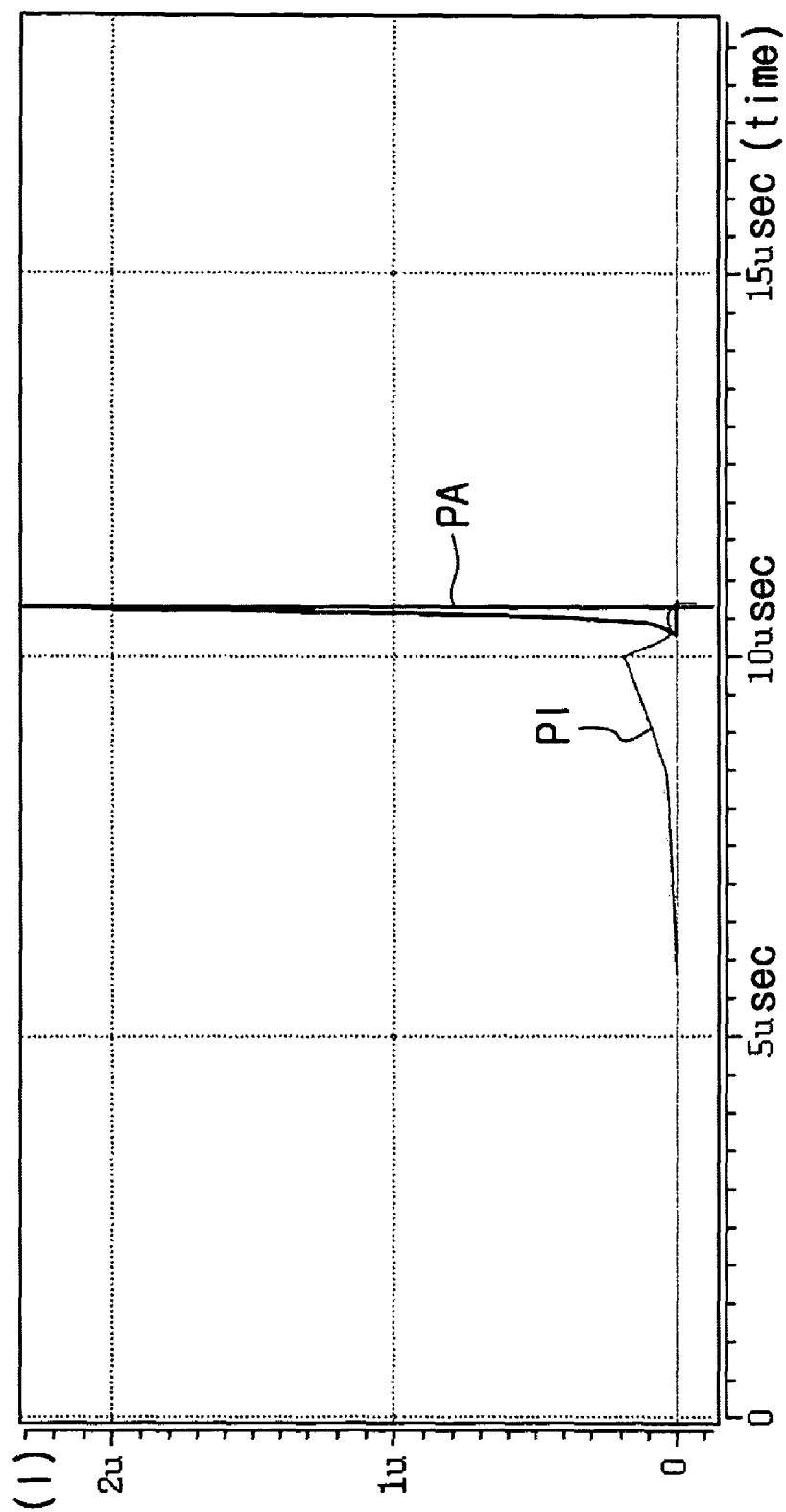
FIG. 8 is a waveform showing a reduction in an inrush current in the circuit of FIG. 4.

FIG. 6 is a block diagram of a semiconductor device which may include a fuse box having a plurality of fuse circuits of FIG. 4. FIG. 7 is a waveform showing a power-up signal generated by the circuit of FIG. 4 in a power-up period and information regarding the status (cut or uncut) of a fuse (hereinafter, referred to as fuse cut/uncut information). FIG. 8 is a waveform showing a reduction in an inrush current in the circuit of FIG. 4.

FIG. 4 shows a fuse circuit for reducing an inrush current during a power-up period, so as to implement a stable power-up operation. The fuse circuit may include a P-type MOS transistor PM1, a fuse FU1, N-type MOS transistors NM1, NM3, NM2a, and NM2b, and an inverter INV1.

In FIG. 4 the N-type MOS transistors NM3 and NM2b function as a current path break section. The P-type MOS transistor PM1, the fuse FU1, the N-type MOS transistors NM1 and NM2a, and the inverter INV1 function as a fuse section. The fuse section, depending on the status of the fuse (cut or uncut), generates a fuse control signal PFU at an output terminal NOC in response to the power-up signal VCCHB. The current path break section detects the status of the fuse in the fuse section preceding the trip period of the power-up signal and breaks an inrush current path created in the fuse section within the trip period of the power-up signal based on the detected fuse status.

The configuration of the fuse section will be described below in detail. The cuttable fuse FU1 is connected to a node ND10. The first P-type MOS transistor PM1 has a gate to which the power-up signal VCCHB is applied, a source to which the power supply voltage VDD is applied, and a drain connected to one end of the fuse FU1. The first N-type MOS transistor NM1 has a drain connected to the other end of the fuse FU1, a gate to which the power-up signal VCCHB is applied, and a source to which the ground voltage is applied. An inverter latch LA1 having the inverter INV1 and the N-type MOS transistor NM2a is connected between node NOB (the other end) of the fuse FU1 and the output terminal NOC so as to latch a voltage level on the drain of the first N-type MOS transistor NM1.

The current path break section includes the second N-type MOS transistor NM3 having a gate to which the power-up signal VCCHB is applied, a drain to which the power supply voltage VDD is applied, and a source connected to the one end of the fuse FU1, and the third N-type MOS transistor NM2b which has a gate connected to the source of the second N-type MOS transistor NM3, and a drain-source channel connected between the latch LA1 and the ground.

In the example embodiment of FIG. 4, the ratio of size of the first N-type MOS transistor NM1 to the size of second N-type MOS transistor NM3 is about 10:1. Put differently, the second N-type MOS transistor NM3 is a relatively weak transistor. The second N-type MOS transistor NM3 detects fuse cut/uncut information PRI as a low level signal prior to the trip period of the power-up signal when the fuse an is uncut, and detects the fuse cut/uncut information PRI as a high level signal prior to and after the trip period of the power-up signal when the fuse FU1 is cut.

Because the N-type MOS transistor NM3 is a relatively small and weak transistor, the circuit of FIG. 4 may cause relatively less loading effect on another circuit (for example, a circuit connected at the output of the circuit of FIG. 4), as compared to the conventional circuit of FIG. 3. Further, the two N-type MOS transistors NM2a and NM2b correspond to the single N-type MOS transistor NM2 of FIG. 3 in size, so there is no substantial increase in the size of the circuit.

Hereinafter, an operation to break the inrush current path created during the trip period of the power-up signal without impairing the normal operation of the fuse circuit and while the fuse is uncut will be described with reference to FIG. 4.

Even though there may be a period during which the P-type MOS transistor PM1 and the N-type MOS transistor NM2a may be on at the same time when the fuse is uncut, the inrush current may not be produced, since, during this time interval, the N-type MOS transistor NM2b is off. That is, as described with reference to FIG. 2, even though the N-type MOS transistor NM2a constituting the inverter latch LA1 may be on (not completely turned off in the trip period (ΔT of FIG. 2)), the fuse cut/uncut information PRI is detected at low level, so the N-type MOS transistor NM2b is off, thereby breaking the inrush current path.

Specifically, the N-type MOS transistor NM1 and the N-type MOS transistor NM3 may be turned on together before the trip period of the power-up signal. However, the size of the N-type MOS transistor NM1 is around ten times larger than the N-type MOS transistor NM3, so the fuse cut/uncut information PRI is at a low level, and the N-type MOS transistor NM2b is off. Further, in the trip period, during which the P-type MOS transistor PM1 starts to turn on and the N-type MOS transistor NM2a starts to turn off, the N-type MOS transistor NM2b is still off, so the inrush current path, which sequentially passes through the P-type MOS transistor PM1, the fuse FU1, and the N-type MOS transistor NM2a, is broken. After the trip period, the fuse cut/uncut information PRI is at a high level, and the P-type MOS transistor PM1 is turned on, so the fuse control signal PFU is output at low level. In this case, the N-type MOS transistor NM2b is turned on to ensure the normal latch operation of the inverter latch LA1.

As described above, when the fuse is uncut, the normal latch operation is ensured, wherein the fuse control signal PFU is maintained at high level before the trip point t1 of the power-up signal VCCHB, at low level after the trip point t1, and no inrush current flows during the trip period. Thus, as shown in FIG. 8, an improved current waveform PI is obtained. In FIG. 8, the horizontal axis represents time measured in microseconds, for example, and the vertical axis represents current (I) measured in microampere, for example. In FIG. 8, it can be seen that the improved current waveform PI has a significantly reduced peak current, as compared with a current waveform PA illustrating an inrush current.

In FIG. 7, the horizontal axis represents time measured in microseconds, for example, and the vertical axis represents voltage (V) measured in volts, for example. In FIG. 7, it can be seen that before the trip point of the power-up signal VCCHB, the fuse cut/uncut information PRI, generated by the N-type MOS transistor NM3, is at about ⅔ of the level of an internal power supply voltage VINT. Note that, when the internal power supply voltage VINT is applied directly to the source of the P-type MOS transistor PM1, the internal power supply voltage VINT is at the same level as the power supply voltage VDD. In FIG. 4, the fuse cut/uncut information PRI generated by the N-type MOS transistor NM3 is discharged to the ground by the N-type MOS transistor NM1.

A circuit operation when a fuse is cut will be described below with reference to FIG. 5. Before the trip period of the power-up signal, the fuse cut/uncut information PRI is at high level due to a cut fuse. During this time, the N-type MOS transistor NM2b is on and the fuse control signal PFU is at a high level. In the trip period, during which the P-type MOS transistor PM1 begins to turn on, there is no inrush current path due to the cut fuse. After the trip period, the fuse cut/uncut information PRI is at high level. Thus the fuse control signal PFU is continuously maintained at high level. As described above, it is seen that normal fuse operation is not affected due to a cut fuse.

FIG. 6 is a block diagram of a semiconductor device 8 including a fuse box 6 having a plurality of fuse circuits of FIG. 4 connected to an internal power voltage generator 2 and a power-up signal generator 4.

As the number of fuse circuits with uncut fuses among the fuse circuits 6A, 6B . . . and 6D in the fuse box 6 is large, a larger amount of inrush current may be prevented by the fuse circuit of FIG. 4, so operational reliability and power supply stability are improved, and deterioration in circuit reliability and instability may be reduced.

In FIG. 6, the internal power voltage generator 2 may receive an external power supply voltage VEXT and generate the internal power supply voltage VINT. The power-up signal generator 4 may generate the power-up signal VCCHB in response to the internal power supply voltage VINT during the power-up operation, and the power-up signal generator 4 may be formed by the circuit shown in FIG. 1, for example.

As described above, the fuse cut/uncut information of the fuse section is detected before the trip period of the power-up signal, and the inrush current path of the fuse section is broken in the trip period of the power-up signal by using the fuse cut/uncut information detected when the fuse is uncut. Therefore, the inrush current in the fuse circuit is reduced without affecting the normal operation of the fuse circuit. As a result, when such a fuse circuit is used in a semiconductor memory device, such as DRAM or the like, operation reliability and power supply stability are improved. However, the semiconductor memory device may not be limited to DRAM and the example embodiments as described above may be used in a volatile memory, such as SRAM or the like, or a nonvolatile semiconductor device, such as a flash memory or the like.

Although the example embodiments have been described with reference to the drawings, it will be obvious to those skilled in the art that various changes and modifications may be made without departing from the technical spirit and scope of the invention. For example, in some cases, the internal connection configuration of the fuse circuit or the element implementation and driving scheme of the current path break section may be modified without departing from the technical spirit and scope of the invention.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A fuse circuit comprising:
   a fuse section which generates a fuse control signal at an output terminal of the fuse circuit in response to a power-up signal according to a status of a fuse in the fuse section; and
   a current path break section which detects the status of the fuse in the fuse section prior to a trip period of the power-up signal and breaks an inrush current path created in the fuse section during the trip period based on the detected status.

2. The fuse circuit of claim 1, wherein the fuse section includes:
   a cuttable fuse;
   a first P-type MOS transistor which has a gate to which the power-up signal is applied, a source to which a power supply voltage is applied, and a drain connected to one end of the fuse;
   a first N-type MOS transistor which has a drain connected to another end of the fuse, a gate to which the power-up signal is applied, and a source to which a ground voltage is applied; and
   a latch which is connected between the another end of the fuse and the output terminal so as to latch a voltage level on the drain of the first N-type MOS transistor.

3. The fuse circuit of claim 2, wherein the current path break section includes:
   a second N-type MOS transistor which has a gate to which the power-up signal is applied, a drain to which the power supply voltage is applied, and a source connected to the one end of the fuse; and
   a third N-type MOS transistor which has a gate connected to the source of the second N-type MOS transistor, and a drain-source channel connected between the latch and the ground voltage.

4. The fuse circuit of claim 3, wherein the second N-type MOS transistor detects the status of the fuse as a low level signal prior to the trip period of the power-up signal when the fuse is uncut.

5. The fuse circuit of claim 3, wherein the second N-type MOS transistor detects the status of the fuse as a high level signal prior to and after the trip period of the power-up signal when the fuse is cut.

6. A semiconductor device comprising:
   an internal power voltage generator which generates an internal power supply voltage;
   a power-up signal generator which generates the power-up signal in response to the internal power supply voltage in a power-up period; and
   at least one fuse circuit according to claim 1.

7. The semiconductor device of claim 6, wherein the fuse section includes:
   a cuttable fuse;
   a first P-type MOS transistor which has a gate to which the power-up signal is applied, a source to which a power supply voltage is applied, and a drain connected to one end of the fuse;
   a first N-type MOS transistor which has a drain connected to another end of the fuse, a gate to which the power-up signal is applied, and a source to which a ground voltage is applied; and
   a latch which is connected to the another end of the fuse and the output terminal so as to latch a voltage level on the drain of the first N-type MOS transistor.

8. The semiconductor device of claim 7, wherein the current path break section includes:
   a second N-type MOS transistor which has a gate to which the power-up signal is applied, a drain to which the power supply voltage is applied, and a source connected to the one end of the fuse; and
   a third N-type MOS transistor which has a gate connected to the source of the second N-type MOS transistor, and a drain-source channel connected between the latch and the ground voltage.

9. The semiconductor device of claim 8, wherein the second N-type MOS transistor detects the status of the fuse as a low level signal prior to the trip period of the power-up signal when the fuse is uncut.

10. The semiconductor device of claim 8, wherein the second N-type MOS transistor detects the status of the fuse as a high level signal prior to and after the trip period of the power-up signal when the fuse is cut.

11. A method of reducing an inrush current in a fuse circuit including a fuse section which generates a fuse control signal at an output terminal in response to a power-up signal based on a status of a fuse, the method comprising:
    detecting the status of the fuse prior to a trip period of the power-up signal; and
    breaking an inrush current path created in the fuse section during the trip period of the power-up signal based on the detected status of the fuse.

* * * * *